US008110342B2

(12) United States Patent
Liu et al.

(10) Patent No.: US 8,110,342 B2
(45) Date of Patent: Feb. 7, 2012

(54) METHOD FOR FORMING AN OPENING

(75) Inventors: Feng Liu, Singapore (SG); Shi-Jie Bai, Singapore (SG); Hong Ma, Singapore (SG); Chun-Peng Ng, Singapore (SG); Ye Wang, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 601 days.

(21) Appl. No.: 12/193,052

(22) Filed: Aug. 18, 2008

(65) Prior Publication Data

US 2010/0040982 A1 Feb. 18, 2010

(51) Int. Cl.
*G03F 7/26* (2006.01)
(52) U.S. Cl. ......................................................... 430/313
(58) Field of Classification Search .................. 430/323, 430/394, 313, 314, 316, 317
See application file for complete search history.

(56) References Cited

U.S. PATENT DOCUMENTS

| | | | |
|---|---|---|---|
| 6,642,138 B2 | 11/2003 | Pan | |
| 6,696,222 B2 | 2/2004 | Hsue | |
| 6,812,145 B2 | 11/2004 | Ma | |
| 7,119,006 B2 * | 10/2006 | Kraft | 438/622 |
| 7,125,806 B2 | 10/2006 | Harada | |
| 7,214,612 B2 | 5/2007 | Huang | |
| 2001/0034106 A1 * | 10/2001 | Moise et al. | 438/396 |
| 2003/0100188 A1 * | 5/2003 | Huang et al. | 438/694 |

* cited by examiner

*Primary Examiner* — Kathleen Duda
*Assistant Examiner* — Caleen Sullivan
(74) *Attorney, Agent, or Firm* — Winston Hsu; Scott Margo

(57) ABSTRACT

A method for forming an opening is disclosed. First, a semiconductor substrate is provided, in which the semiconductor substrate includes at least one metal interconnects therein. A stacked film is formed on the semiconductor substrate, in which the stacked film includes at least one dielectric layer and one hard mask. The hard mask is used to form an opening in the stacked film without exposing the metal interconnects, and the hard mask is removed thereafter. A barrier layer is later deposited on the semiconductor substrate to cover a portion of the dielectric layer and the surface of the metal interconnects.

25 Claims, 10 Drawing Sheets

METHOD FOR FORMING AN OPENING

BACKGROUND OF THE INVENTION

1. Field of the Invention

The invention relates to a method for forming an opening, and more particularly, to a method for forming an opening for damascene structures.

2. Description of the Prior Art

With the progress of the semiconductor industry, performance and economic factors of integrated circuit design and manufacture have caused the scale of devices of integrated circuits to be drastically reduced in size and increased in proximity on a chip. However, performance of integrated circuits not only depends on reliability of the devices, but also relies on metal interconnections used to transmit signals between the devices. Therefore, integrated circuit fabrication on semiconductor structures for ultra scale integration (ULSI) requires multiple levels of metal interconnections for electrically connecting the miniaturized semiconductor devices. To overcome difficulties in fabricating metal interconnection in multi-layer, the damascene structure has been extensively researched and developed. As the resistive coefficient of copper is lower than that of other metals, such as aluminum, and copper has the advantage of better electro-migration resistance while low-k material effectively reduces resistance-capacitance (RC) delay effects between metal interconnections, single copper damascene structure and copper damascene structures and low-k insulating materials have been widely used in fabrication of integrated circuits. Accordingly, the copper damascene process is taken as the technique that can solve metal interconnection problem of deep sub-half micro integrated circuits in the future.

It should be noted in the conventional art, the deposition of barrier layer is conducted while the hard mask is still disposed on the dielectric layer. As a result, the barrier layer not only covers the bottom of the opening and the sidewall of the dielectric layer, but also covers a portion of the hard mask. As the critical dimension of the fabrication decreases, the blocking of the hard mask significantly lowers the incident angle for the sputtering of the barrier layer, which creates great difficulty to form a barrier layer having continuous profile on the sidewall of the dielectric layer. The incontinuous profile of the barrier layer ultimately causes the electroplated copper metal to form voids and produces and lowers the performance of the damascene structure.

SUMMARY OF THE INVENTION

It is an objective of the present invention to provide a method of forming openings of a damascene structure for solving the aforementioned problem.

According to a preferred embodiment of the present invention, the method for forming an opening includes the steps of: providing a semiconductor substrate having at least one metal interconnects therein; forming a stacked film on the semiconductor substrate, in which the stacked film comprises at least one dielectric layer and one hard mask; utilizing the hard mask to form an opening in the stacked film without exposing the metal interconnects; removing the hard mask; and forming a barrier layer on the semiconductor substrate to cover a portion of the dielectric layer and the surface of the metal interconnects.

According to an embodiment of the present invention, another method for forming an opening includes the steps of: providing a semiconductor substrate having at least one metal interconnects therein; forming a stacked film on the semiconductor substrate, in which the stacked film comprises at least one dielectric layer and one hard mask; utilizing the hard mask to form an opening in the stacked film without exposing the metal interconnects; removing the hard mask; depositing a barrier layer on the semiconductor substrate to cover a portion of the dielectric layer and the surface of the metal interconnects; depositing a metal layer in the opening; and performing a chemical mechanical polishing process to remove a portion of the metal layer and the barrier layer such that the surface of the metal layer is even with the surface of the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
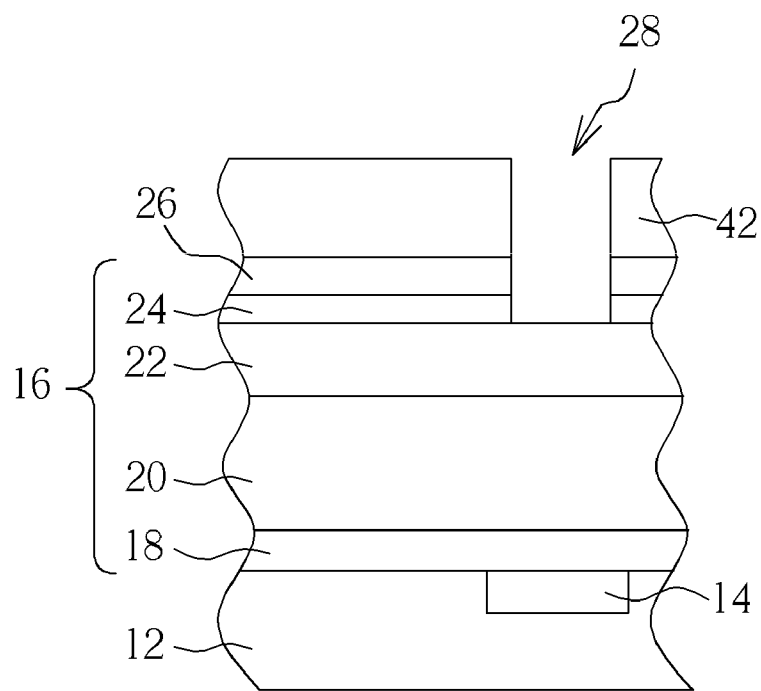
FIGS. 1-5 illustrate a method for fabricating a single damascene structure according to a first embodiment of the present invention.

Referring to FIGS. 1-5, FIGS. 1-5 illustrate a method for fabricating a single damascene structure according to a first embodiment of the present invention. As shown in FIG. 1, a semiconductor substrate 12, such as a silicon substrate or silicon on insulator substrate is provided. The semiconductor substrate 12 includes at least one metal interconnects 14 therein, in which the metal interconnects 14 are selected from a group consisting of Cu, Ti, TiN, Ta, TaN, and W.

A stacked film 16 is then deposited on the semiconductor substrate 12. The stacked film 16 is composed of a plurality of dielectric layers 18, 20, 22, and a metal hard mask 24. Each of the dielectric layers 18, 20, 22 is a low-k dielectric layer, an ultra low-k dielectric layer, or a normal dielectric layer, such as a porous low-k dielectric layer or a layer composed of carbon-doped oxide (CDO), organosilicate glass (OSG), fluorinated silicate glass (FSG), silicon oxynitride (SiON), silicon nitride, TEOS, or ultra low-k material (k<2.5). The dielectric layers 18, 20, 22 can be formed by processes including chemical vapor deposition (CVD), spin-coating, plasma-enhanced chemical vapor deposition, and high density plasma chemical vapor deposition.

In this embodiment, the dielectric layer 18 is a NBLOK comprised of SiCN or a silicon nitride layer, the dielectric layer 20 is a porous low-k dielectric or a SiLK provided by Dow Chemical Company, the dielectric layer 22 is composed of SiON, and the hard mask 24 is preferably selected from a group consisting of Ti, TiN, Ta, TaN, Al, and AlCu. It should be noted that the metal hard mask 24 utilized in the present embodiment can be replaced by other materials. For instance, other non-metallic materials such as spin-on glass (SOG), oxides, amorphous carbon, polysilicon, or amorphous silicon can also be utilized to fabricate the hard mask 74, which are all within the scope of the present invention.

Next, an insulating layer 26 composed of silicon oxynitride (SiON) is deposited over the surface of the hard mask 24, and a pattern transfer process is performed by forming a patterned photoresist 42 on the insulating layer 26 and conducting an etching process to form an opening 28 in the insulating layer 26 and the hard mask 24. The insulating layer 26 preferably serves as a bottom anti-reflective layer in this embodiment.

Figure 2:
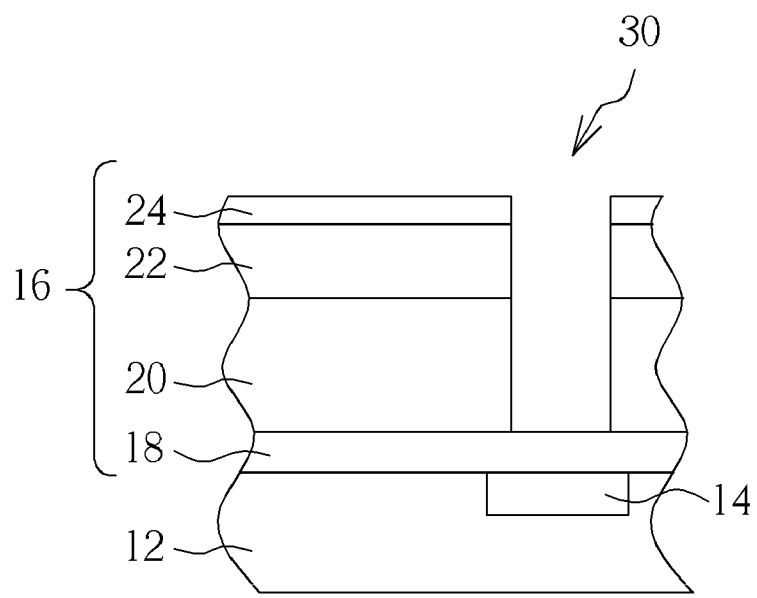

After stripping the patterned photoresist 42 and the insulating layer 26 by using an ashing or descum process, as shown in FIG. 2, another pattern transfer process is performed by using the patterned hard mask 24 as mask to etch the dielectric layers 20, 22. This pattern transfer process partially transfers the opening pattern of the patterned hard mask 24 to the dielectric layers 20, 22 and forms a corresponding opening 30 in the dielectric layers 20, 22. It should be noted that while forming the opening 30 in the stacked film 16, the opening 30 may be extended into the dielectric layer 18, but the metal interconnects 14 embedded within the semiconductor substrate 12 is not exposed. Moreover, a polymer layer may be formed on the sidewall of the opening 30 as a result of the etch gas used, and an oxygen plasma process could selectively performed to remove this polymer layer.

Figure 3:
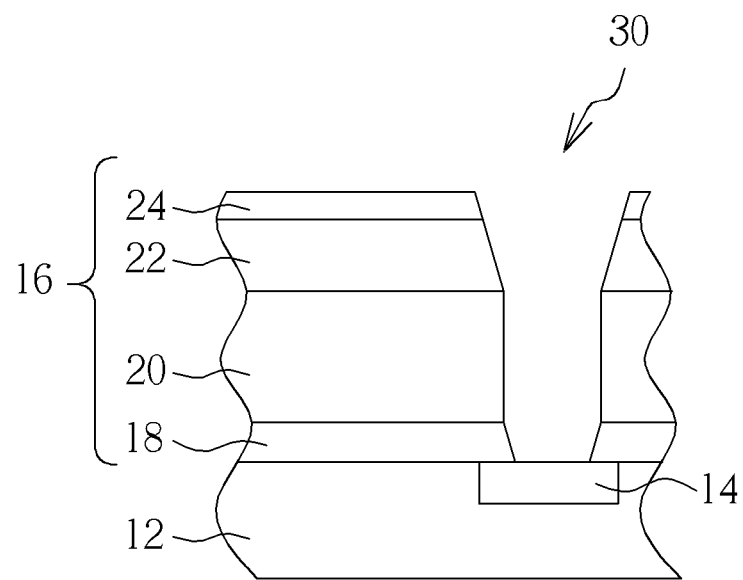

As shown in FIG. 3, an etching process, such as a plasma etching is performed by using chlorine gas ($Cl_2$) to selectively remove a portion of the patterned hard mask 24. In this embodiment, the sidewall of the patterned hard mask 24 is pulled back by the etching gas to form a substantially tapered pattern. Thereafter, another etching is performed by using etching chemical composed of ChxFy to remove a portion of the dielectric layer 18 for exposing the metal interconnects 14, in which the x and y from the ChxFy are preferably whole numbers. It should be noted that as a portion of the dielectric layer 18 is removed, a portion of the sidewall of the dielectric layer 22 is removed accordingly to form a substantially tapered pattern as the patterned hard mask 24.

Figure 4:
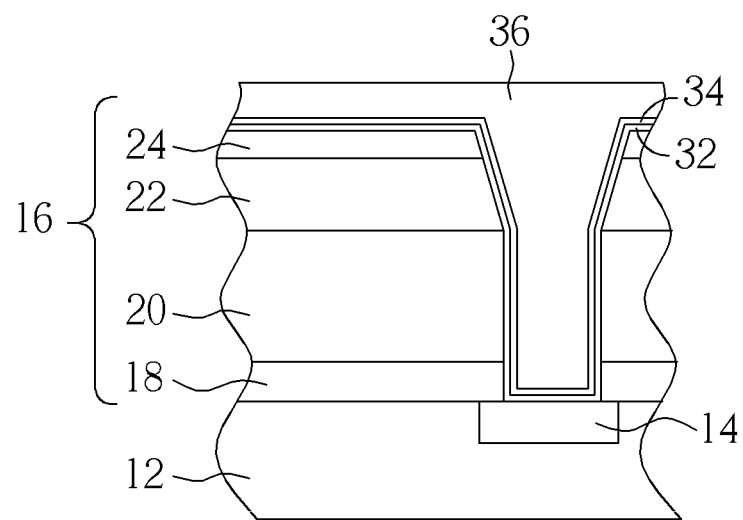

Next, as shown in FIG. 4, a barrier layer 32 and a seed layer 34 are sputtered over the exposed surface of the patterned hard mask 24, dielectric layers 18, 20, 22 and the metal interconnects 14. The barrier layer 32 is preferably a single or composite layer composed of Ti, TiN, Ta, and TaN, which not only prevents copper from diffusing into the dielectric layers 18, 20, 22, but also increases the adhesiveness between the single damascene structure and the metal later disposed on the single damascene structure. The seed layer 34 is formed to provide a conducting path for the electrical currents, as well as utilized as a nucleating layer for the growth of copper metal. Subsequently, an electroplating process is performed to form a metal layer 36 composed of copper over the surface of the seed layer 34 and into the opening 30.

Figure 5:
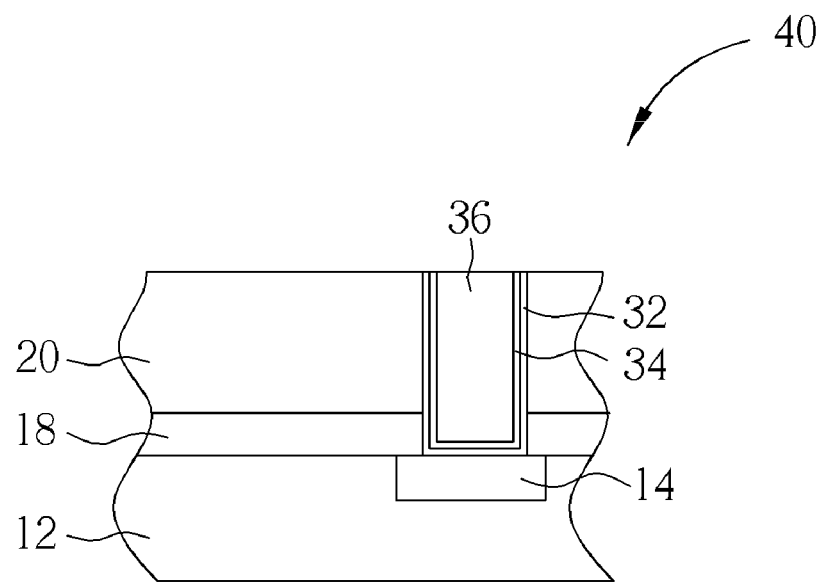

As shown in FIG. 5, one or more chemical mechanical polishing process is performed to remove a portion of the metal layer 36, the seed layer 34, the barrier layer 32, the patterned hard mask 24 and the dielectric layer 22, such that the remaining portion of the metal layer 36 within the opening 30 is substantially even with surface of the dielectric layer 20. This completes the fabrication of a single damascene structure 40.

Figure 6:
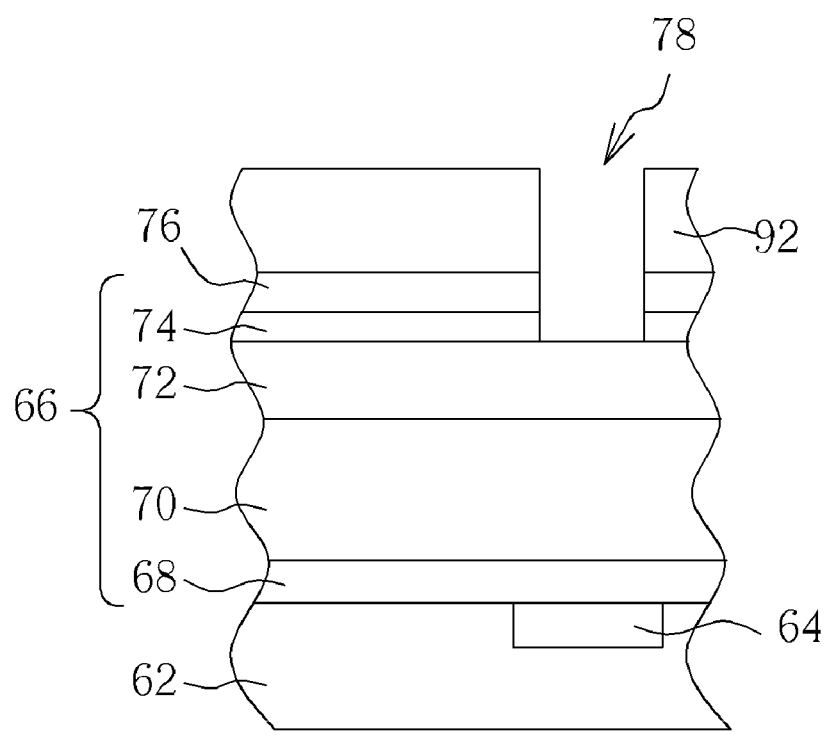
FIGS. 6-10 illustrate a method for fabricating a single damascene structure according to a second embodiment of the present invention.

Referring to FIGS. 6-10, FIGS. 6-10 illustrate a method for fabricating a single damascene structure according to a second embodiment of the present invention. As shown in FIG. 6, a semiconductor substrate 62, such as a silicon substrate or silicon on insulator substrate is provided. The semiconductor substrate 62 includes at least one metal interconnects 64 therein, in which the metal interconnects 64 are selected from a group consisting of Cu, Ti, TiN, Ta, TaN, and W.

A stacked film 66 is then deposited on the semiconductor substrate 62. The stacked film 66 is composed of a plurality of dielectric layers 68, 70, 72, and a metal hard mask 74. Each of the dielectric layers 68, 70, 72 is a low-k dielectric layer, an ultra low-k dielectric layer, or a normal dielectric layer, such as a porous low-k dielectric layer or a layer composed of carbon-doped oxide (CDO), organosilicate glass (OSG), fluorinated silicate glass (FSG), silicon nitride, TEOS, or ultra low-k material (k<2.5). The dielectric layers 68, 70, 72 can be formed by processes including chemical vapor deposition (CVD), spin-coating, plasma-enhanced chemical vapor deposition, and high density plasma chemical vapor deposition.

In this embodiment, the dielectric layer 68 is a NBLOK comprised of SiCN or a silicon nitride layer, the dielectric layer 70 is a porous low-k dielectric or a SiLK provided by Dow Chemical Company, the dielectric layer 72 is composed of TEOS, and the hard mask 74 is preferably selected from a group consisting of Ti, TiN, Ta, TaN, Al, and AlCu. It should be noted that the metal hard mask 74 utilized in the present embodiment can be replaced by other materials. For instance, other non-metallic materials such as spin-on glass (SOG), oxides, amorphous carbon, polysilicon, or amorphous silicon can also be utilized to fabricate the hard mask 74, which are all within the scope of the present invention.

Next, an insulating layer 76 composed of silicon oxynitride (SiON) is deposited over the surface of the hard mask 74, and a pattern transfer process is performed by forming a patterned photoresist 92 on the insulating layer 76 and conducting an etching process to form an opening 78 in the insulating layer 76 and the hard mask 74. The insulating layer 76 preferably serves as a bottom anti-reflective layer in this embodiment.

Figure 7:
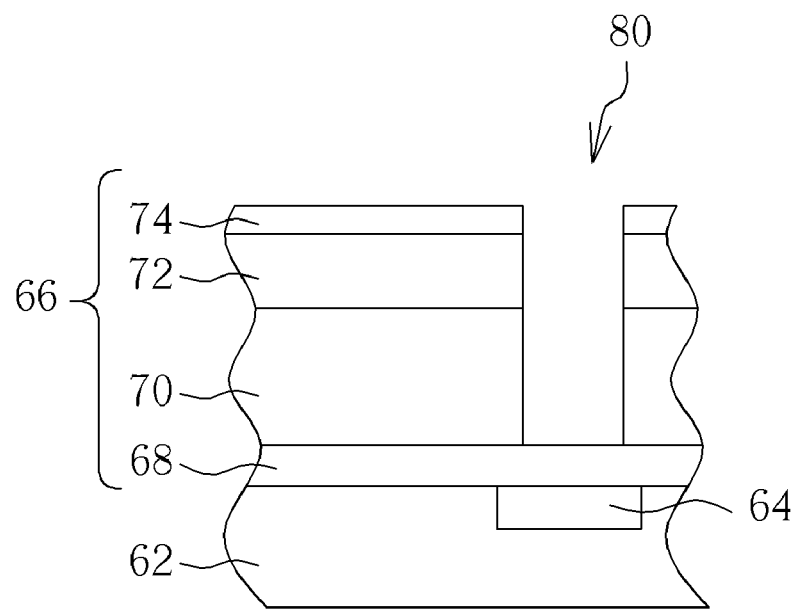

After stripping the patterned photoresist 92 and the insulating layer 76 by using an ashing or descum process, as shown in FIG. 7, another pattern transfer process is performed by using the patterned hard mask 74 as mask to etch the dielectric layers 70, 72. This pattern transfer process partially transfers the opening pattern of the patterned hard mask 74 to the dielectric layers 70, 72 and forms a corresponding opening 80 in the dielectric layers 70, 72. It should be noted that while forming the opening 80 in the stacked film 66, the opening 80 may be extended into the dielectric layer 68, but the metal interconnects 64 embedded within the semiconductor substrate 62 is not exposed.

Figure 8:
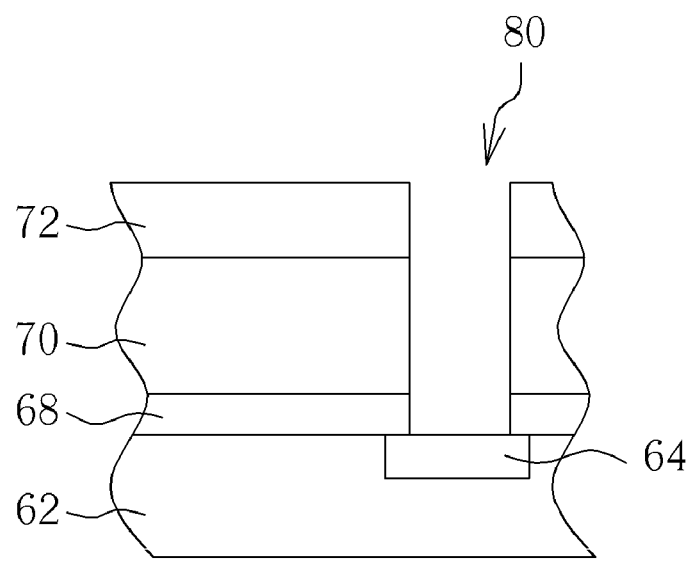

As shown in FIG. 8, an etching process is used to remove the patterned hard mask 74, and another etching process is conducted to remove a portion of the dielectric layer 68 for exposing the metal interconnects 64. Alternatively, the dielectric layer 68 and the patterned hard mask 74 can be removed simultaneously to expose the metal interconnects 64, which are all within the scope of the present invention. It should also be noted that the steps from using the patterned hard mask 74 to form the opening 80 within the dielectric layers 70, 72 to removing the hard mask 74 thereafter are conducted in different chambers of one main frame.

Figure 9:
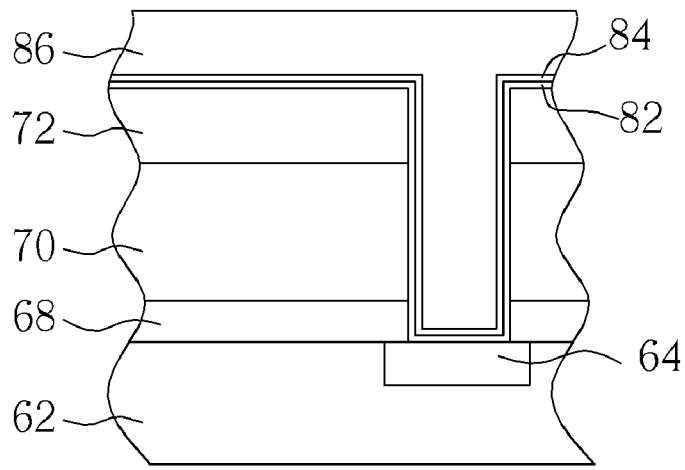

Next, as shown in FIG. 9, a barrier layer 82 and a seed layer 84 are sputtered over the exposed surface of the dielectric layers 68, 70, 72 and the metal interconnects 64. The barrier layer 82 is preferably a single or composite layer composed of Ti, TiN, Ta, and TaN, which not only prevents copper from diffusing into the dielectric layers 68, 70, 72, but also increases the adhesiveness between the single damascene structure and the metal later disposed on the single damascene structure. The seed layer 84 is formed to provide a conducting path for the electrical currents, as well as utilized as a nucleating layer for the growth of copper metal. Subsequently, an electroplating process is performed to form a metal layer 86 composed of copper over the surface of the seed layer 84 and into the opening 80.

Figure 10:
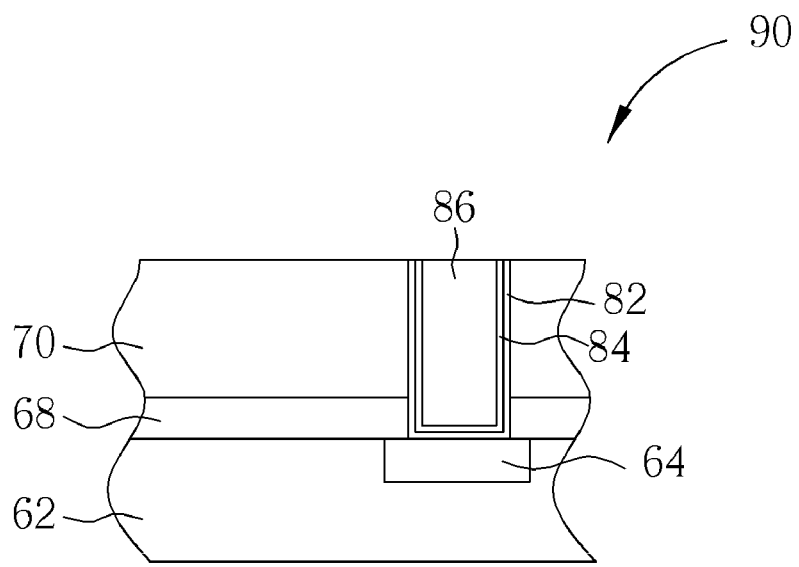

As shown in FIG. 10, one or more chemical mechanical polishing process is performed to remove a portion of the metal layer 86, the seed layer 84, the barrier layer 82, and the dielectric layer 72, such that the remaining portion of the metal layer 86 within the opening 80 is substantially even with surface of the dielectric layer 70. This completes the fabrication of a single damascene structure 90.

Figure 11:
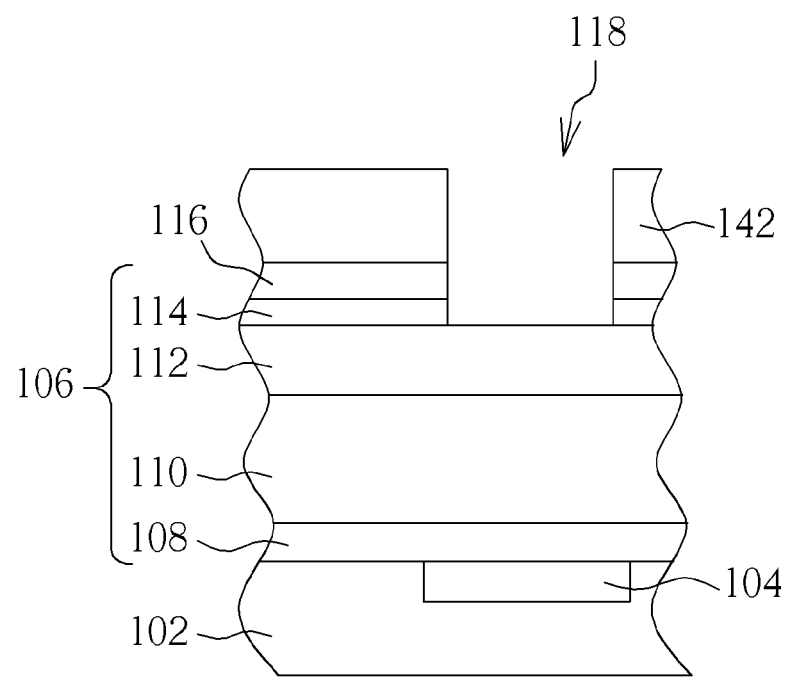
FIGS. 11-16 illustrate a method for fabricating a dual damascene structure according to a third embodiment of the present invention.

Referring to FIGS. 11-16, FIGS. 11-16 illustrate a method for fabricating a dual damascene structure according to a third embodiment of the present invention. As shown in FIG. 11, a semiconductor substrate 102, such as a silicon substrate or silicon on insulator substrate is provided. The semiconductor substrate 102 includes at least one metal interconnects 104 therein, in which the metal interconnects 104 are selected from a group consisting of Cu, Ti, TiN, Ta, TaN, and W.

A stacked film 106 is then deposited on the semiconductor substrate 102. The stacked film 106 is composed of a plurality of dielectric layers 108, 110, 112, and a metal hard mask 114. The material of the dielectric layers 108, 110, 112 is similar to the material of the dielectric layers 68, 70, 72 as disclosed in the first embodiment, and the material of the hard mask 114 is also similar to the material of the hard mask 74 as disclosed in the first embodiment. In this embodiment, the dielectric layer 108 is a NBLOK comprised of SiCN, the dielectric layer 110 is a porous low-k dielectric or a SiLK provided by Dow Chemical Company, the dielectric layer 112 is composed of TEOS, and the hard mask 114 is preferably composed of a group consisting of Ti, TiN, Ta, TaN, Al, and AlCu. Similar to the first embodiment, the metal hard mask 114 utilized in the present embodiment can be replaced by other materials. For instance, other non-metallic materials such as spin-on glass (SOG), oxides, amorphous carbon, polysilicon, or amorphous silicon could also be used to fabricate the hard mask 114, which are all within the scope of the present invention.

Next, an insulating layer 116 composed of silicon oxynitride (SiON) is deposited over the surface of the hard mask 114, and a pattern transfer process is performed by forming a patterned photoresist 142 on the insulating layer 116 and conducting an etching process to form an opening 118 in the insulating layer 116 and the hard mask 114 for defining a trench of the dual damascene structure. The insulating layer 116 preferably serves as a bottom anti-reflective layer in this embodiment.

Figure 12:
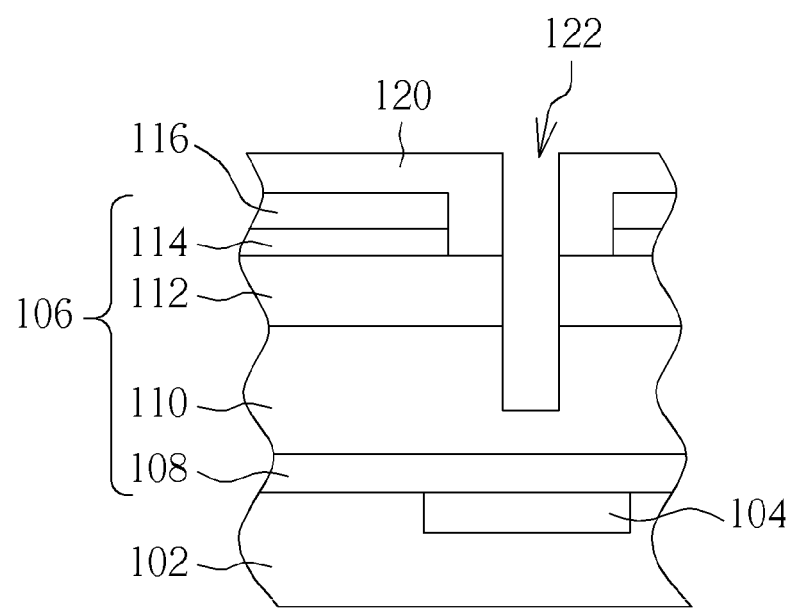

After stripping the patterned photoresist 142 by using an ashing or descum process, as shown in FIG. 12, another photoresist 120 is disposed on the insulating layer 116 and the dielectric layer 112, and an etching process is conducted by using the patterned photoresist 120 as a mask to remove a portion of the dielectric layers 108, 110 for forming a partial via 122 in the dielectric layers 108, 110. Similar to the aforementioned embodiment, this etching process would form a partial via 122 corresponding to the opening of the patterned photoresist 120 but would not expose the metal interconnects 104 embedded in the semiconductor substrate 102.

Figure 13:
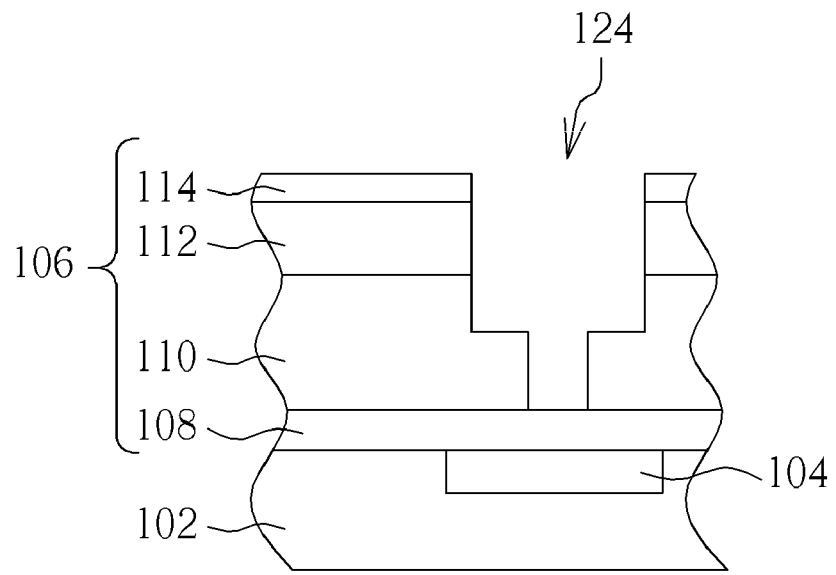

As shown in FIG. 13, after removing the patterned photoresist 120 and the insulating layer 116 by using an ashing or descum process, another etching process is performed by using the patterned hard mask 114 as a mask to form a trench 124 in the dielectric layers 110, 112. It should be noted that the trench 124 may be over-etched into the dielectric layer 108. Nevertheless, the metal interconnects 104 embedded within the semiconductor substrate 102 is not exposed.

Figure 14:
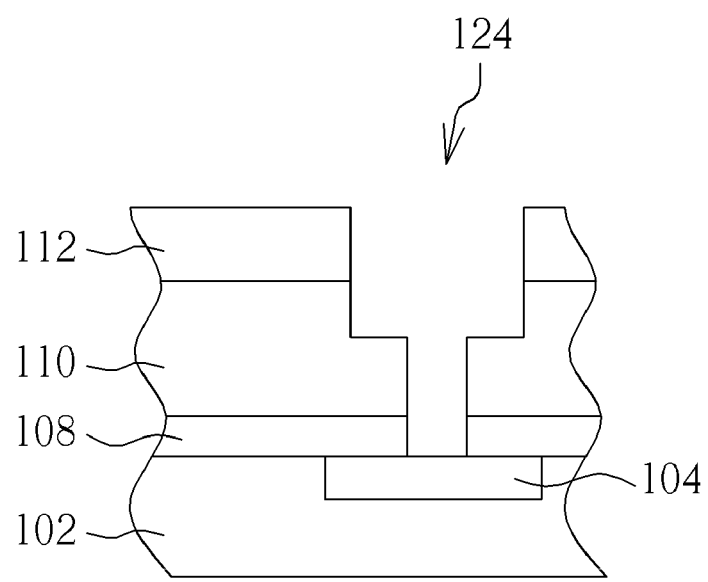

As shown in FIG. 14, an etching process is used to remove the patterned hard mask 114, and another etching process is conducted to remove the dielectric layer 108 remained in the trench 124 for exposing the metal interconnects 104. Alternatively, the dielectric layer 108 remained in the trench 124 and the patterned hard mask 114 can be removed simultaneously to expose the metal interconnects 104, which are all within the scope of the present invention. It should also be noted that the steps from forming the patterned photoresist 120 to the formation of the trench 124 can be conducted in different chambers of one main frame.

Figure 15:
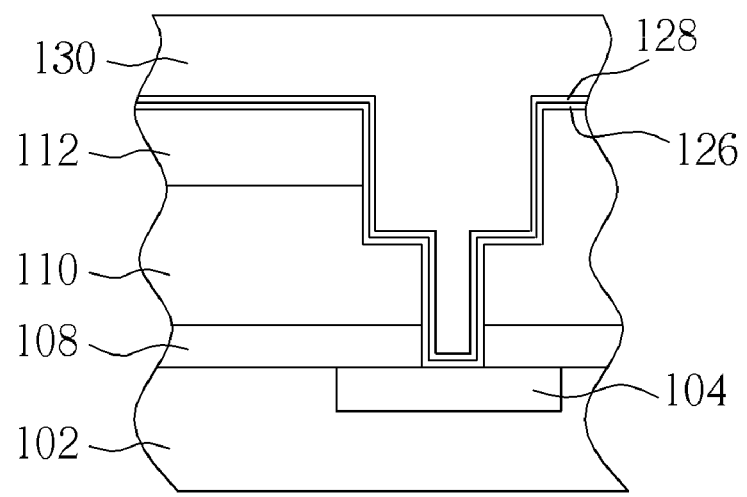

Next, as shown in FIG. 15, a barrier layer 126 and a seed layer 128 are sputtered over the surface of the dielectric layers 108, 110, 112 and the metal interconnects 104. The barrier layer 126 is preferably a single or composite layer composed of Ti, TiN, Ta, and TaN, which not only prevents copper from diffusing into the dielectric layers 108, 110, 112, but also increases the adhesiveness between the single damascene structure and the metal later disposed on the single damascene structure. Subsequently, an electroplating process is performed to form a metal layer 130 composed of copper over the surface of the seed layer 128 and into the trench 124 and the via 122.

Figure 16:
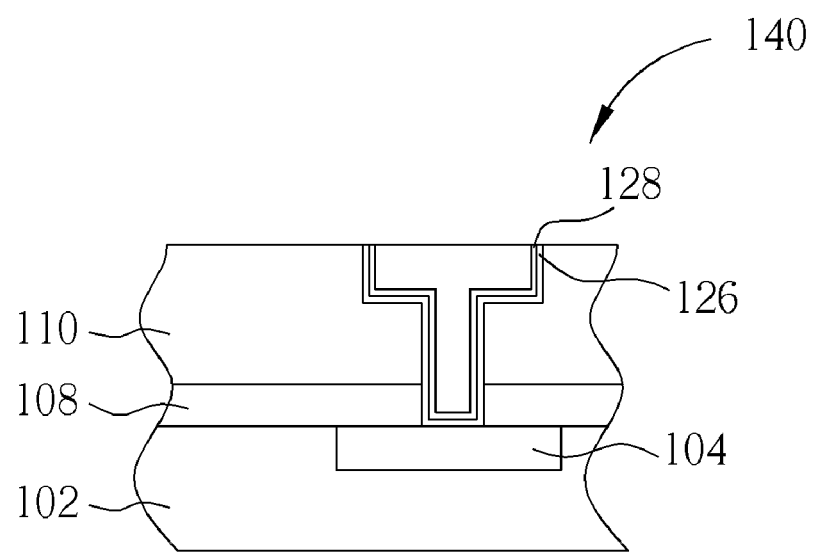

As shown in FIG. 16, one or more chemical mechanical polishing process is performed to remove a portion of the metal layer 110, the seed layer 128, the barrier layer 126, and the dielectric layer 112, such that the remaining portion of the metal layer 130 within the trench 124 is substantially even with surface of the dielectric layer 110. This completes the fabrication of a dual damascene structure 140. It should be noted that this embodiment specifically incorporates the steps of completely removing the hard mask from the second embodiment with a dual damascene process. Alternatively, the steps of partially removing the hard mask as disclosed in the first embodiment could also be incorporated with a dual damascene process, which are all within the scope of the present invention.

Figure 17:
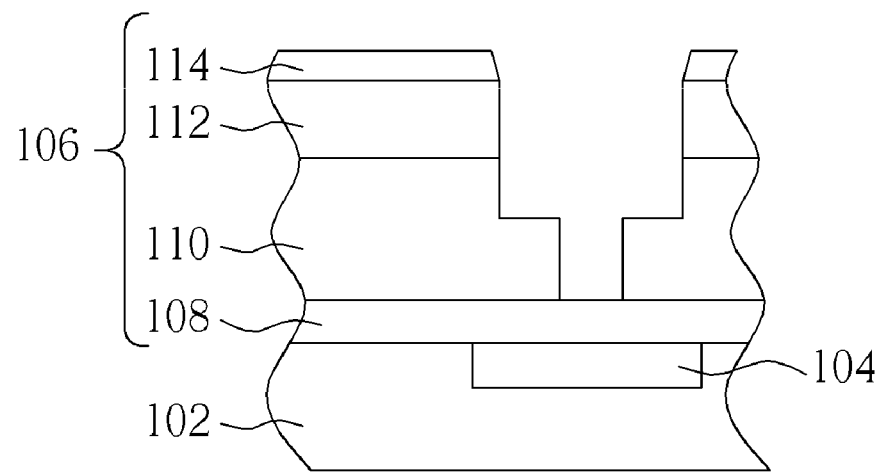
FIGS. 17-19 illustrate a method for fabricating a dual damascene structure according to a fourth embodiment of the present invention.
Figure 18:
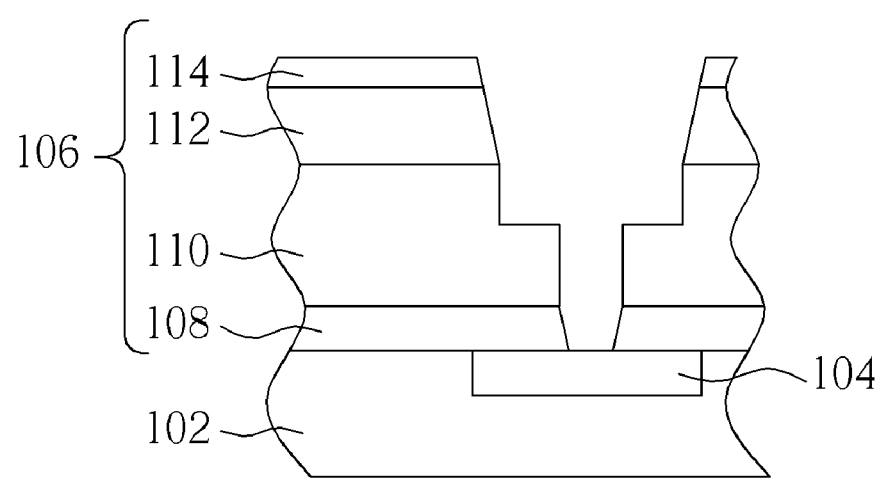
Figure 19:
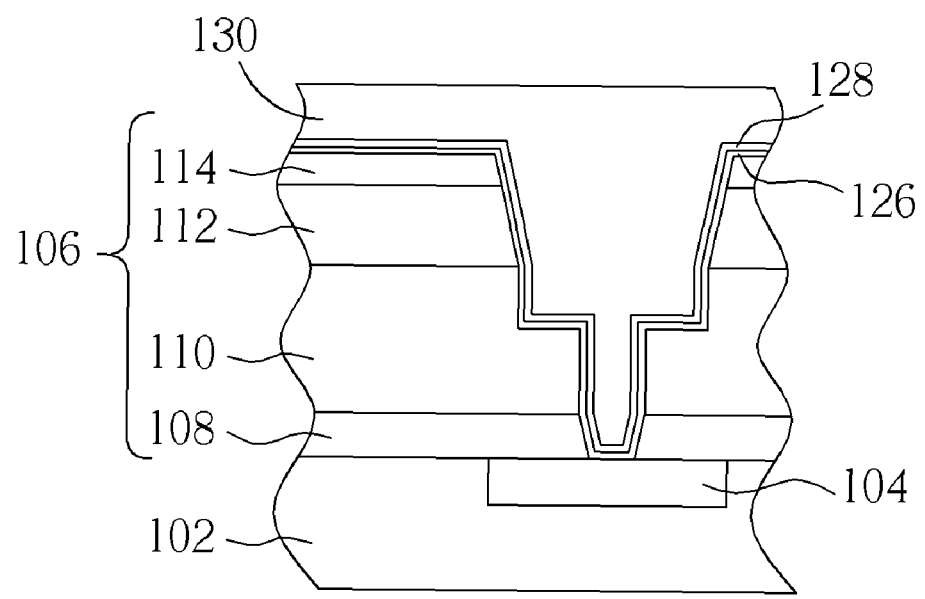

Referring to FIGS. 17-19, FIGS. 17-19 illustrate a method for fabricating a dual damascene structure according to a fourth embodiment of the present invention. As shown in FIG. 17, processes throughout FIGS. 12-13 are performed by first utilizing SiON as the dielectric layer 112, and then forming a corresponding via 122 and trench 124 in the patterned hard mask 114, the dielectric layer 110 and 112.

Next, an etching process, such as a plasma etching is performed by using chlorine gas ($Cl_2$) to selectively remove a portion of the patterned hard mask 114. In this embodiment, the sidewall of the patterned hard mask 114 is pulled back by the etching gas to form a substantially tapered pattern.

As shown in FIG. 18, another etching is performed by using etching chemical composed of $C_hH_xF_y$ to remove a portion of the dielectric layer 108 for exposing the metal interconnects 104, in which the x and y from the $C_hH_xF_y$ are preferably whole numbers. It should be noted that as a portion of the dielectric layer 108 is removed, a portion of the sidewall of the dielectric layer 112 is removed accordingly to form a substantially tapered pattern as the patterned hard mask 114.

As shown in FIG. 19, a barrier layer 126 and a seed layer 128 are sputtered over the surface of the patterned hard mask 114, the dielectric layers 108, 110, 112 and the metal interconnects 104. The barrier layer 126 is preferably a single or composite layer composed of Ti, TiN, Ta, and TaN. Subsequently, an electroplating process is performed to form a metal layer 130 composed of copper over the surface of the seed layer 128 and filling into the trench 124 and the via 122. Thereafter, one or more chemical mechanical polishing process is performed to remove a portion of the metal layer 110, the seed layer 128, the barrier layer 126, and the dielectric layer 112, such that the remaining portion of the metal layer 130 within the trench 124 is substantially even with surface of the dielectric layer 110.

Overall, the present invention partially or completely removes the hard mask used to form the trench opening of a damascene structure before the deposition of the barrier layer, and conducts the barrier sputtering and copper electroplating thereafter. As the removal of the hard mask increases the incidence angle for the sputtering of the barrier layer, the present invention could form a barrier layer having continuous profile on the sidewall of the dielectric layers, which could prevent the copper electroplated on the barrier layer thereafter from producing voids.

Those skilled in the art will readily observe that numerous modifications and alterations of the device and method may be made while retaining the teachings of the invention.

What is claimed is:

1. A method for forming an opening, comprising:
   providing a semiconductor substrate having at least one metal interconnects therein;
   forming a stacked film on the semiconductor substrate, wherein the stacked film comprises at least one liner covering the metal interconnects, at least one dielectric layer and one hard mask;
   utilizing the hard mask to form an opening in the stacked film without exposing the metal interconnects;
   removing the hard mask;
   removing the liner to expose the metal interconnects after removing the hard mask; and
   forming a barrier layer on the semiconductor substrate to cover a portion of the dielectric layer and the surface of the metal interconnects.

2. The method of claim 1, further comprising:
   patterning the hard mask after forming the opening in the stacked film; and
   utilizing the patterned hard mask to etch the stacked film for forming the opening.

3. The method of claim 1, further comprising:
   patterning the hard mask after forming the opening in the stacked film;
   disposing a patterned photoresist on the semiconductor substrate to cover the patterned hard mask;
   utilizing the patterned photoresist to etch the stacked film for forming a via;
   stripping the patterned photoresist; and
   utilizing the patterned hard mask to etch the stacked film for forming the opening.

4. The method of claim 1, further comprising:
   forming an insulating layer on the hard mask after forming the stacked film; and
   utilizing a patterned photoresist to pattern the insulating layer and the hard mask.

5. The method of claim 1, wherein the dielectric layer is selected from a group consisting of TEOS, silicon nitride, porous low-k dielectric, SiON, NBLOK comprised of SiCN, and SiLK.

6. The method of claim 1, wherein the hard mask is a metal hard mask.

7. The method of claim 6, wherein the metal hard mask is selected from a group consisting of polysilicon, Ti, TiN, Ta, TaN, Al, and AlCu.

8. The method of claim 1, wherein the metal interconnects are selected from a group consisting of Cu, Ti, TiN, Ta, TaN, and W.

9. The method of claim 1, further comprising exposing the metal interconnects while removing the hard mask.

10. The method of claim 1, wherein the steps of forming the opening in the stacked film and removing the hard mask are conducted in different chambers of one main frame.

11. The method of claim 1, further comprising forming an etch stop layer between the dielectric layer and the hard mask.

12. The method of claim 1, further comprising:
    patterning the hard mask;
    forming a patterned photoresist on the semiconductor substrate to cover the patterned hard mask;
    utilizing the patterned photoresist to etch the stacked film for forming a via;
    stripping the patterned photoresist; and
    utilizing the patterned hard mask to etch the stacked film for forming a trench.

13. A method for forming an opening, comprising:
    providing a semiconductor substrate having at least one metal interconnects therein;
    forming a stacked film on the semiconductor substrate, wherein the stacked film comprises at least one dielectric layer and one hard mask;
    utilizing the hard mask to form an opening in the stacked film without exposing the metal interconnects;
    partially removing the hard mask; and
    forming a barrier layer on the semiconductor substrate to cover a portion of the hard mask, the dielectric layer and the surface of the metal interconnects.

14. The method of claim 13, further comprising utilizing a plasma etching process to partially remove the hard mask, such that the sidewall of the hard mask is pulled up for forming a tapered pattern.

15. The method of claim 14, further comprising utilizing chlorine gas for performing the plasma etching process.

16. The method of claim 13, further comprising:
    patterning the hard mask after forming the opening in the stacked film; and
    utilizing the patterned hard mask to etch the stacked film for forming the opening.

17. The method of claim 13, further comprising:
    patterning the hard mask after forming the opening in the stacked film;
    disposing a patterned photoresist on the semiconductor substrate to cover the patterned hard mask;
    utilizing the patterned photoresist to etch the stacked film for forming a via;
    stripping the patterned photoresist; and
    utilizing the patterned hard mask to etch the stacked film for forming the opening.

18. The method of claim 13, further comprising:
    forming an insulating layer on the hard mask after forming the stacked film; and
    utilizing a patterned photoresist to pattern the insulating layer and the hard mask.

19. The method of claim 13, wherein the dielectric layer is selected from a group consisting of TEOS, silicon nitride, porous low-k dielectric, SiON, NBLOK comprised of SiCN, and SiLK.

20. The method of claim 13, wherein the hard mask is a metal hard mask.

21. The method of claim 20, wherein the metal hard mask is selected from a group consisting of polysilicon, Ti, TiN, Ta, TaN, Al, and AlCu.

22. The method of claim 13, wherein the metal interconnects are selected from a group consisting of Cu, Ti, TiN, Ta, TaN, and W.

23. The method of claim 13, further comprising exposing the metal interconnects after partially removing the hard mask.

24. The method of claim 13, wherein the steps of forming the opening in the stacked film and partially removing the hard mask are conducted in different chambers of one main frame.

25. The method of claim 13, further comprising forming an etch stop layer between the dielectric layer and the hard mask.

* * * * *